United States Patent
Burstein et al.

(10) Patent No.: US 8,885,426 B1
(45) Date of Patent: Nov. 11, 2014

(54) COMPRESSION OF CONTENT ENTRIES IN STORAGE FOR REPLACING FAULTY MEMORY CELLS

(71) Applicant: Inphi Corporation, Santa Clara, CA (US)

(72) Inventors: Andrew Burstein, Santa Clara, CA (US); Nirmal Saxena, Santa Clara, CA (US); Javier Villagomez, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 130 days.

(21) Appl. No.: 13/778,531

(22) Filed: Feb. 27, 2013

Related U.S. Application Data

(60) Provisional application No. 61/664,001, filed on Jun. 25, 2012.

(51) Int. Cl.
- *G11C 29/00* (2006.01)
- *G11C 29/04* (2006.01)
- *G11C 29/18* (2006.01)
- *G11C 29/40* (2006.01)

(52) U.S. Cl.
CPC ............... *G11C 29/04* (2013.01); *G11C 29/18* (2013.01); *G11C 29/40* (2013.01)
USPC ............................ 365/201; 365/149; 365/200

(58) Field of Classification Search
CPC ........ G11C 29/04; G11C 29/10; G11C 29/18; G11C 29/40
USPC .......................................... 365/201, 149, 200
See application file for complete search history.

(56) References Cited

U.S. PATENT DOCUMENTS

| | | | |
|---|---|---|---|
| 6,484,278 B1 * | 11/2002 | Merritt et al. | 714/719 |
| 6,486,493 B2 * | 11/2002 | Arimoto et al. | 257/48 |
| 7,359,261 B1 * | 4/2008 | Wu et al. | 365/200 |

* cited by examiner

*Primary Examiner* — Tan T. Nguyen
(74) *Attorney, Agent, or Firm* — Richard T. Ogawa; Ogawa P.C.

(57) ABSTRACT

A method of manufacturing a dynamic random access memory device is provided. The method includes testing a DRAM device using a testing process. The method includes identifying, under control by a computing device, a plurality of bad memory cells from the DRAM device and determining a list of addresses associated with the plurality of bad memory cells. The method includes sorting the list of addresses in either ascending or descending order and subjecting the information from the sorted list of address to a compression process, under control by the computing device, to provide a compressed format including a first content entry in the sorted list and a series of off-set values as provided by a recurrence relationship. The method also stores the compressed format into a non-volatile memory.

21 Claims, 13 Drawing Sheets

| Rank ID | Bank ID | Row Address | Column Address | | Spare ID |
|---|---|---|---|---|---|
| 0 | 3 | 0x0A81 | 0x00C1 | | 0 |
| 0 | 3 | 0x1BC1 | 0x01E0 | | 1 |
| 1 | 0 | 0x0C03 | 0x032D | | 1 |
| 1 | 1 | 0x0047 | 0x0004 | | 0 |
| 1 | 1 | 0x0161 | 0x00CC | | 0 |
| 1 | 2 | 0x1958 | 0x006E | | 0 |
| 1 | 2 | 0x04DA | 0x01E9 | | 1 |
| 1 | 3 | 0x098C | 0x000E | | 1 |

FIGURE 2

| 1 | +5 | +2 | +3 | +4 | +17 | +7 = 39 |
|---|---|---|---|---|---|---|
| ESCnSiB[0] | dramID[4:0] | rank[1:0] | cid[2:0] | bank[3:0] | row[16:0] | col[9:3] |
| $D_{n-1}$[Quanta: 0] | ... | | | $D_1$[Quanta: 0] | | $D_0$[Quanta: 0] |

- Field Description
  - ESCnSiB[0]:  0 = ESC Entry and 1 = SiB Entry
  - dramID[4:0]: Identifies the DRAM device within a rank. One of 18 in x4 or one of 9 in x8 devices.
  - rank[1:0]: Rank ID for one of 4 ranks
  - cid[2:0]: Chip ID
  - bank[3:0]: Identifies one of 16 bans in the DRAM device within a rank and dramID.
  - row[16:0]: Row Address assuming up to 8Gbit DDR4 DRAM, 2Gx4
  - col[9:3]: 7-bit column address on 8-phase burst granularity

- First Location Has Uncompressed 39-bit Record

- Subsequent Offset Locations have Delta Encoded Compressed Record

FIGURE 8

- Delta Offset is Determined by Concatenating

$D_{i-1}[Quanta - 1:0] \| D_{i-2}[Quanta - 1:0] \| ... \| D_0[Quanta - 1:0]$

- Such That

$D_{i-1}[Quanta] = 1 | D_{i-2}[Quanta] = 0, ..., D_0[Quanta] = 0$

- Next Delta Offset Starts at $D_i[Quanta:0]$

- The Value of Quanta Influences Compression Factor
  - Compression Factor = 100 x Compressed Size / Uncompressed Size

FIGURE 9

$$Expected\_Offset\_Value = \frac{2^{39}}{4 \times 18 \times 1024} \approx = 2^{22.83}$$

$$Expected\_Compression\_Factor = 100 \, x \, \frac{(22.83)}{39} = 58.53$$

No Quantization Overhead is Assumed 58.53 is the Best Expected Compression Factor Quantization has Non-Monotonic Impact on Compression Factor

FIGURE 10

Uncompressed Size in Bits = 4 x 18 x 1024 x 39 = 2875392

| Delta Quanta Size (bits) | Average Compressed Size in Bits | Standard Deviation in Bits | Average Compression Factor | Compression Factor 99.73% Confidence |
|---|---|---|---|---|
| 1 | 2755776 | 636 | 95.83% | 95.91% |
| 2 | 2122236 | 738 | 73.80% | 73.85% |
| 3 | 1935600 | 673 | 67.31% | 67.36% |
| 5 | 1803906 | 627 | 62.73% | 62.78% |
| 8 | 1913698 | 743 | 66.55% | 66.63% |
| 11 | 1768063 | 211 | 61.48% | 61.51% |
| 18 | 2250974 | 2000 | 78.28% | 78.49% |
| 20 | 1759613 | 1131 | 61.19% | 61.31% |
| 21 | 1654455 | 698 | 57.53% | 57.61% |

Compression Factor = 100 x Compressed Size / Uncompressed Size

FIGURE 11

COMPRESSION OF CONTENT ENTRIES IN STORAGE FOR REPLACING FAULTY MEMORY CELLS

CROSS-REFERENCES TO RELATED APPLICATIONS

The present application is a continuation-in part application of and incorporates by reference, for all purposes, the following patent application: U.S. Provisional Application No. 61/664,001, commonly assigned.

COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright © 2013 Inphi Corporation.

BACKGROUND OF THE DISCLOSURE

The present invention relates generally to solid state memory techniques. More particularly, the present invention provides methods and devices for repairing a "bad memory cell" with a substitute cell for a memory device such as a dynamic random access memory ("DRAM") device or others.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

BRIEF SUMMARY OF THE INVENTION

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

In an embodiment, the present invention provides a method of manufacturing a dynamic random access memory device. The method can include testing a DRAM device using a testing process. The DRAM device can include a plurality of memory arrays, each of which have a plurality of memory cells. The DRAM device can be tested under the control of a computing device to identify a plurality of bad memory cells from the DRAM device. These bad memory cells can be faulty or weak memory cells.

A list of addresses associated with the plurality of bad memory cells can be determined and sorted in an ascending or descending order. The information from this sorted list of address can be subjected to a compression process under control by the computing device. The compression process can provide a compressed format including a first content entry in the sorted list and a series of off-set values as provided by a recurrence relationship.

In a specific embodiment, the first content entry is uncompressed while the series of off-set values are Delta Encoded Entries, or the like. The compression process can include successively storing each of the off-set values within a size of a quanta. A specific quanta size can be determined depending on desired application. Multiple quanta can be used if the off-set value is larger than the size of the quanta.

The compressed format can be stored into a non-volatile memory. An interface integrated circuit device coupled to the DRAM device can be initialized to perform a decompression process of the compressed format in the non-volatile memory. The decompression process can be executed during an in-field repair process. The decompressed list of address can be loaded into an address match table. This address match table can configured to receive the address listing and be used for facilitating the replacement of bad, faulty, or weak memory cells with spare memory cells.

In an embodiment, the present invention provides a module apparatus, which can be the resulting dynamic random access memory device from the method of manufacture described previously. The apparatus can include a non-volatile memory device, which can be a monolithically integrated non-volatile memory, including an address listing of a plurality of bad memory cells of a memory device. This address listing can be configured as a compressed format including a first content entry in a sorted list of the address listing and a series of off-set values as provided by a recurrence relationship. The apparatus can also include an address a match table configured for receiving the address listing from the non-volatile memory device in an uncompressed format from the compressed format. The addresses within the address list can include Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 illustrates a simplified Address Match Table according to an embodiment of the present invention.

FIG. 8 illustrates a simplified diagram of an address list according to an embodiment of the present invention.

FIG. 9 illustrates a simplified mathematical representation of an address list according an embodiment of the present invention.

FIG. 10 illustrates a simplified mathematical representation of an address list according to an embodiment of the present invention.

FIG. 11 illustrates a simplified table of compression factors for an address lit according to an embodiment of the present invention.

DETAILED DESCRIPTION OF SPECIFIC EMBODIMENTS OF THE DISCLOSURE

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the weak DRAM cells. Further details of the present system and method can be found throughout the present specification and more particularly below.

Example: Utilizing an Address Match Table in Memory Interface Circuit, Controlling Spare Memory Storage Cells to Dynamically Replace Faulty Storage Cells in Memory Devices, as illustrated by FIG. 1.

Figure 1:
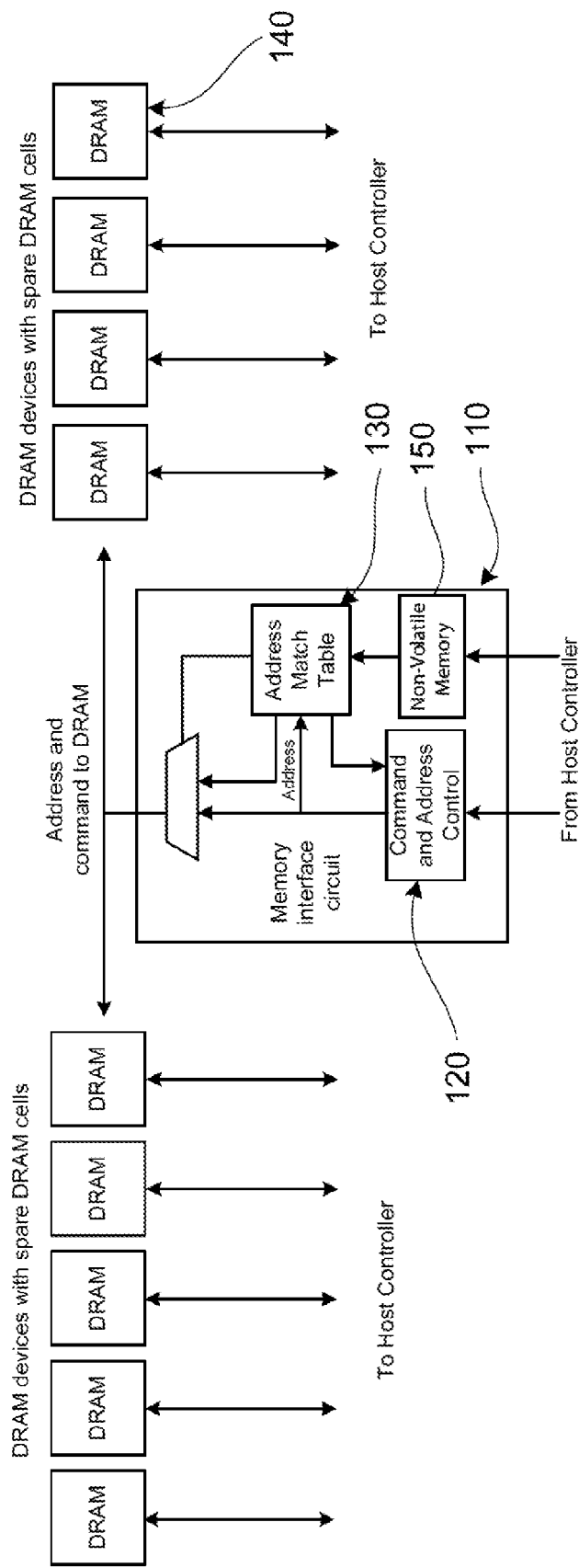
FIG. 1 illustrates a simplified block diagram of an interface circuit according to an embodiment of the present invention.

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table (AMT), labeled as 130. The enhanced memory interface circuit re-drives addresses and commands from the host controller to the DRAM devices, one of which is labeled as 140 in FIG. 1. Also, a non-volatile memory (NVM) 150 can be coupled to the address match table 130 the host controller. This NVM can store compressed address listings and decompress the listings upon initiation or other trigger event and populate the AMT 130.

The DRAM devices contain spare DRAM cells, the addresses of which the enhanced memory interface circuit can select and effect the replacement of faulty or weak storage cell locations, as illustrated by the Table in FIG. 2. As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations. The spare ID may be used to indicate data bus offset as to select subset(s) of DRAM devices to respond to the selection of a spare location. For example, the offset ID may indicate, for example, that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

Figure 3:
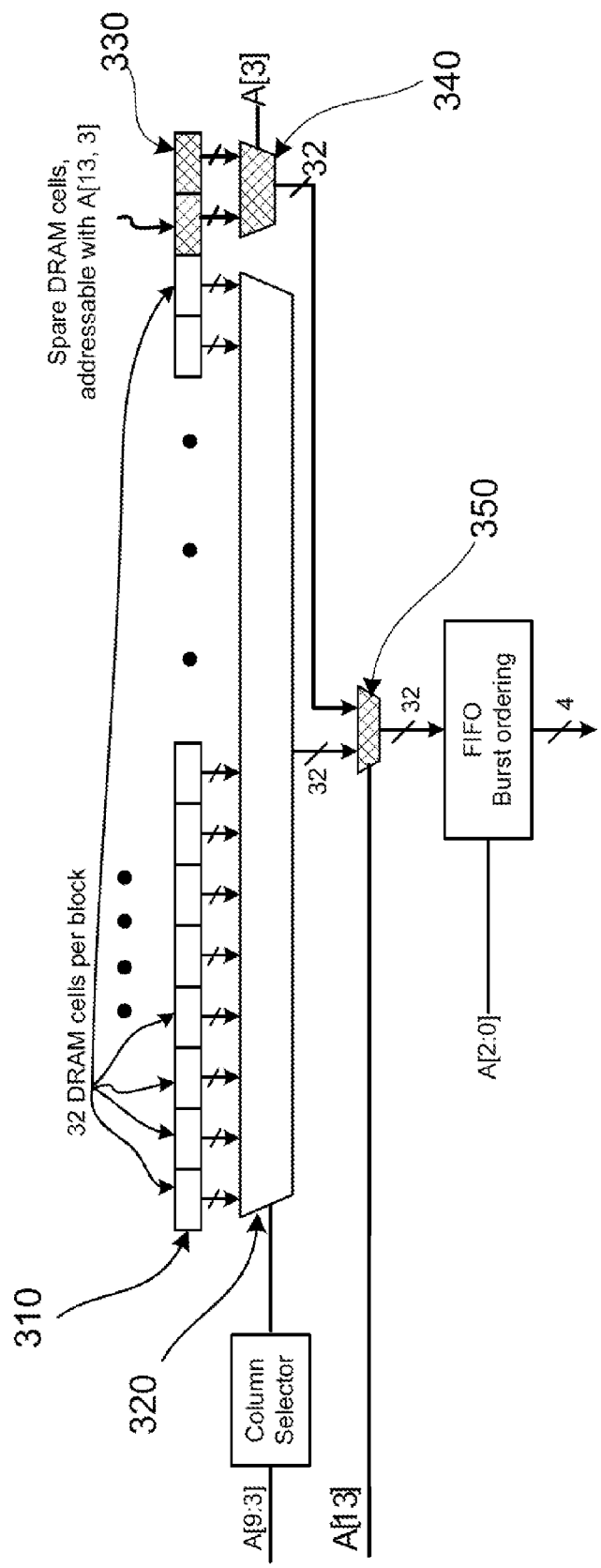
FIG. 3 illustrates a simplified diagram of spare memory cells in a DRAM device according to an embodiment of the present invention.

FIG. 3 shows an exemplary implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that in the exemplary DRAM device, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.

AMT: Address Match Table
CID: Chip ID
IFR: In-Field Repair
LRDIMM: Load-Reduced Dual Inline Memory Module
MB: Memory Buffer
MemBIST: Software tool to generate built in self test blocks for a memory matrix as a
VHDL model for the whole memory system.
RCD: Registering Clock Driver, Also known more simply as the "Register"
RDIMM: Registered Dual Inline Memory Module
RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, weak cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific weak bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the RDIMM or LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known faulty or weak DRAM storage cells.

Figure 4:
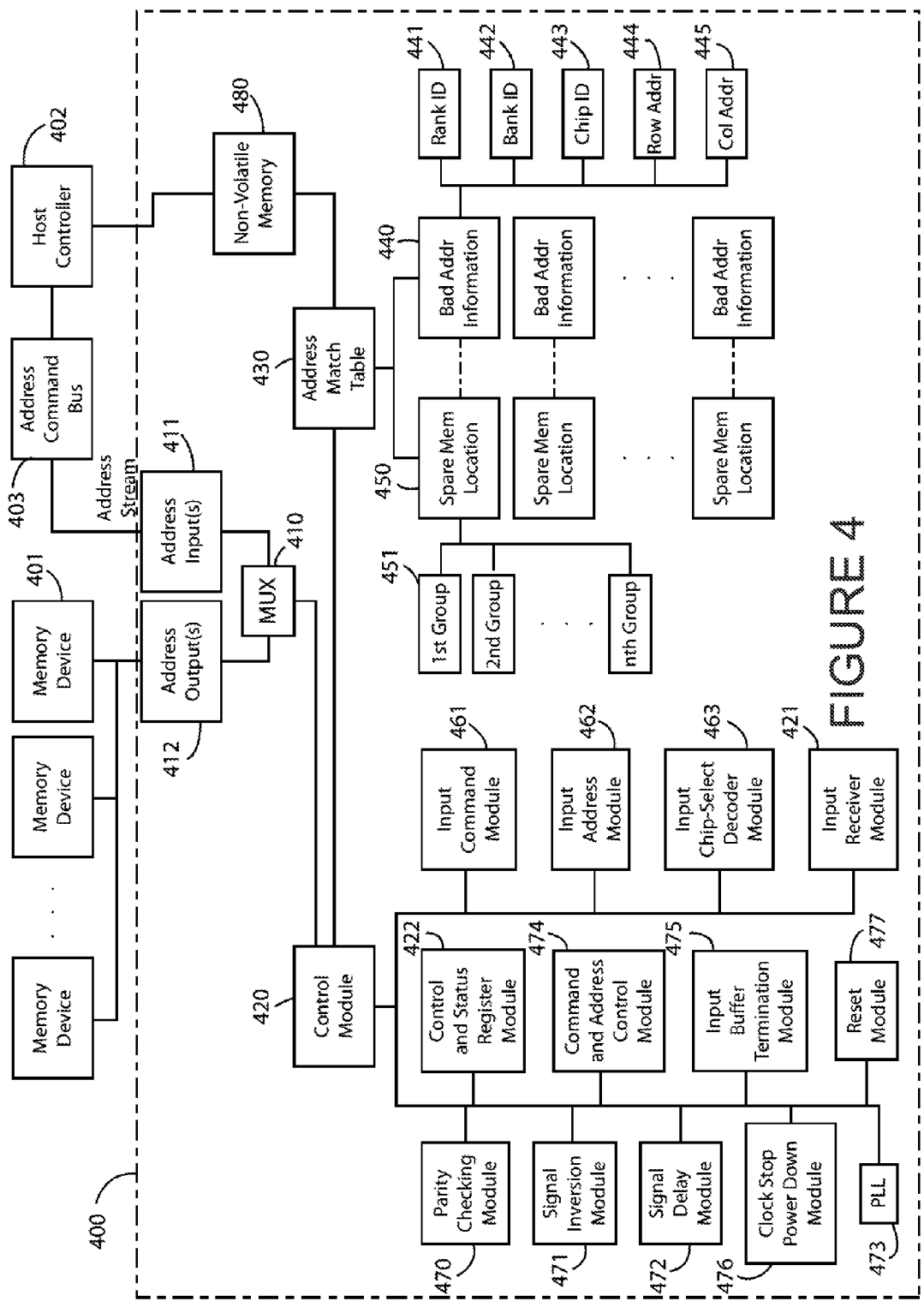
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columnsin-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

Also, a non-volatile memory (NVM) 480 can be coupled to the address match table 430 the host controller 402. This NVM can store compressed address listings and decompress the listings upon initiation or other trigger event and populate the AMT 430. The non-volatile member can include, among others, ROM, Flash, or others, depending upon the embodiment.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
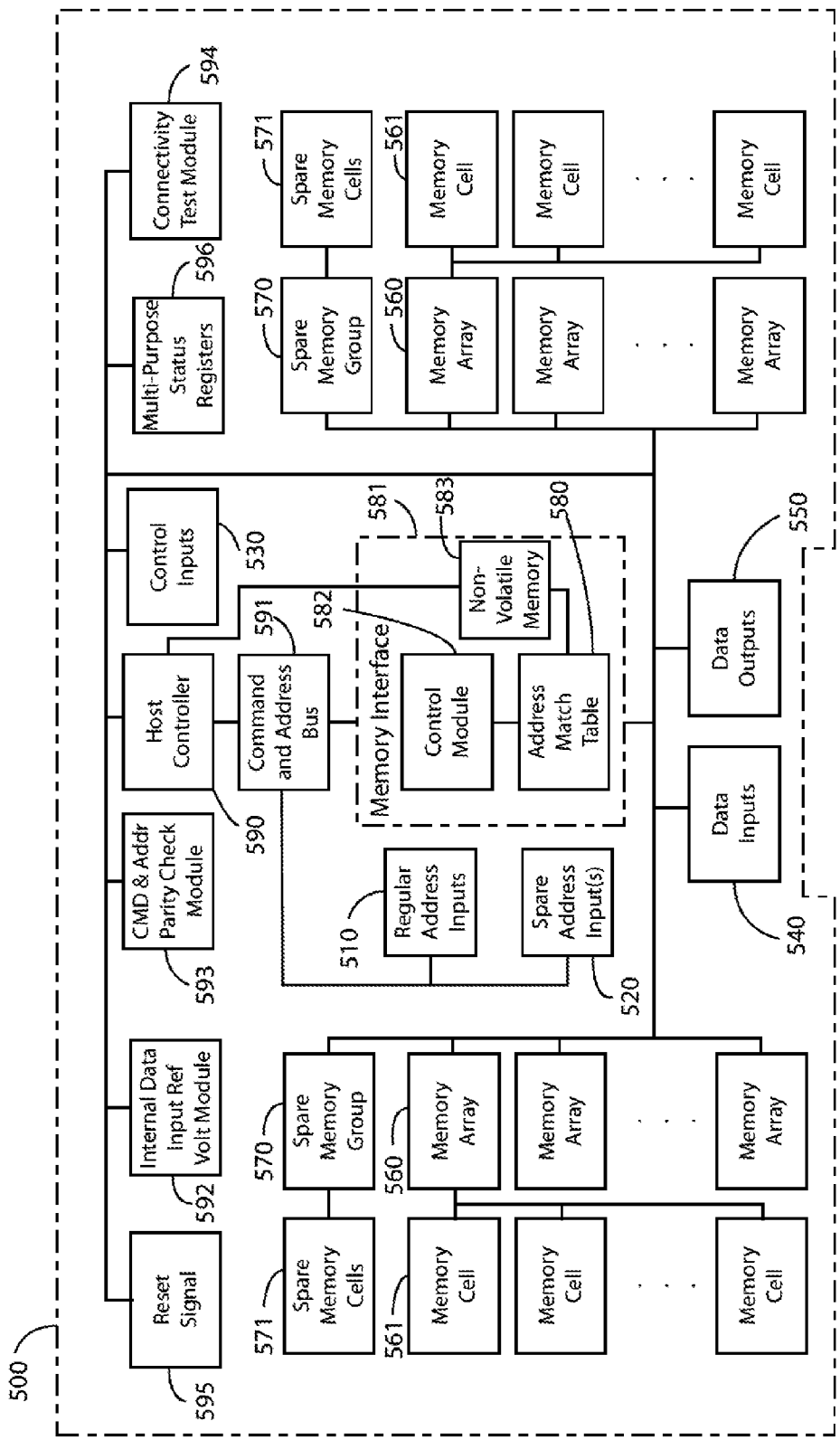
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

Also, a non-volatile memory (NVM) 583 can be coupled to the address match table 580 the host controller 590. This NVM can store compressed address listings and decompress the listings upon initiation or other trigger event and populate the AMT 580.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below:

1. Receive, at an address input(s) of a memory interface device, address information from an address stream of a host computer;
2. Process the address stream from an address command bus coupled to the host controller during a run time operation;
3. Compare successively each address from the address stream from information in an address match table to determine to whether an address matches with a stored address in an address match table;
4. Identify a bad address provided in the address match table; and
5. Replace the bad address with a revised address of a spare memory location;
6. Transfer the revised address to a multiplexer coupled to the address output;
7. Drive address information from an address output(s) of the memory interface device to a plurality of memory devices; and
8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
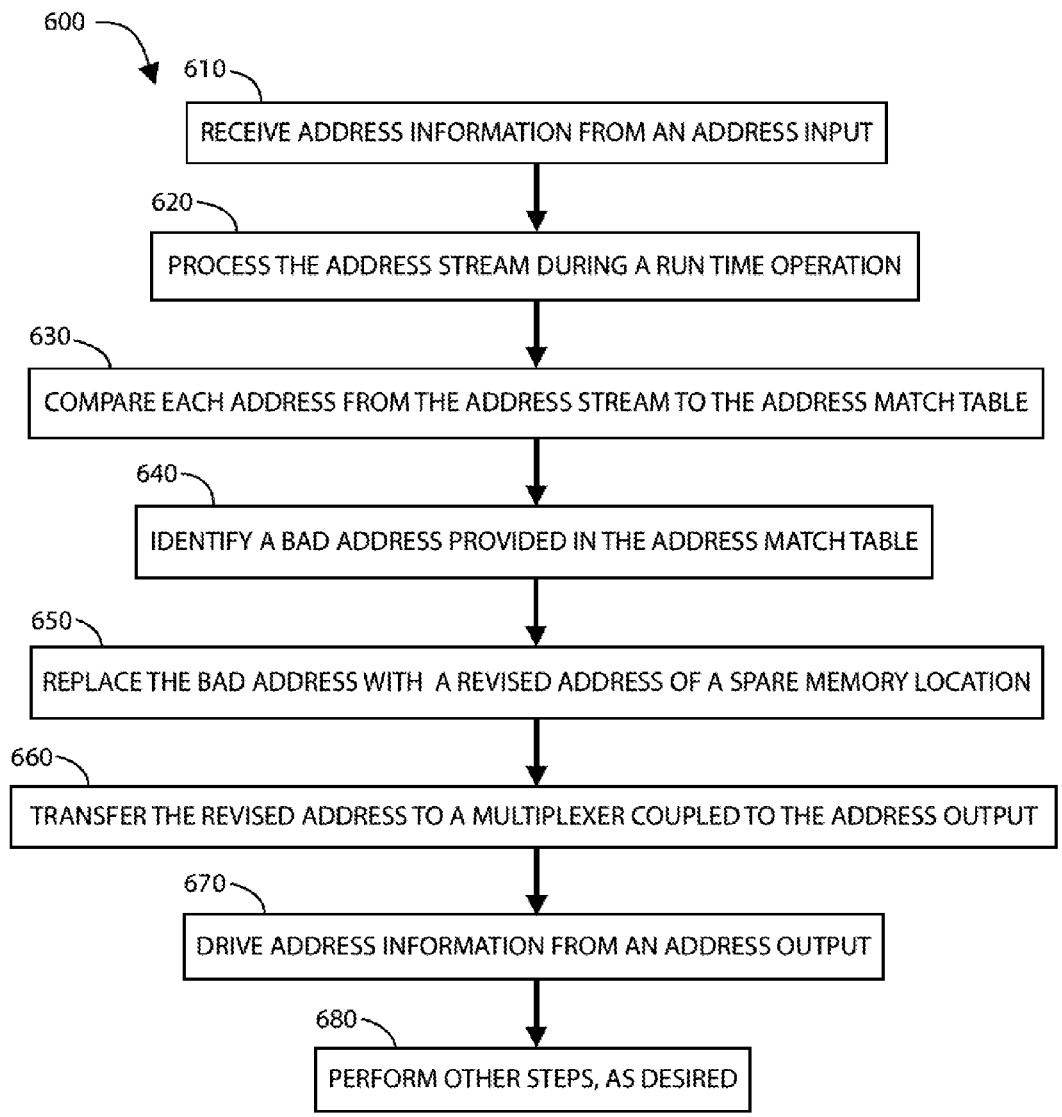
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer. The memory interface device can be selected from a register device, a buffer device, an advanced memory buffer, or a buffer on-board. These memory devices can include a plurality of DRAM devices, Flash devices, or other like devices and combinations thereof.

During a run time operation, the address stream from an address command bus coupled to the host controller can be processed, step 620. Each address from the address stream can be compared successively to determine whether an address matches with a stored address in an address match table, step 630. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680.

Various embodiments of the present invention provide for dynamic random access memory devices and their methods of manufacture. These embodiments can be applied to application specific integrated circuits (ASICs). Many ASICs have on-chip non-volatile storage that is updated during manufacture time. The contents in this non-volatile storage can server carious use case models including, but not limited to:

Stored encryption keys and chip-ID
ASIC system firmware
ASIC configuration management & control information
Diagnostic and error log information The number of content entries, in some applications, is very large, and this makes the instrumentation of on-chip non-volatile memory storage uneconomical. In addition, there are sometimes area constraints on the ASIC chip that require reduction of non-volatile storage area. Content entry compression is one way to accomplish this storage area reduction; however, the ASIC chip requires efficient decompression methods to read content entries from the compressed non-volatile storage.

Embodiments of the present invention describe an optimization architecture for:

Compressing a fixed list of random content entries in an on-chip non-volatile storage.
Reading compressed content entries from the non-volatile storage and decompressing the contents into an on-chip volatile memory.

Figure 7:
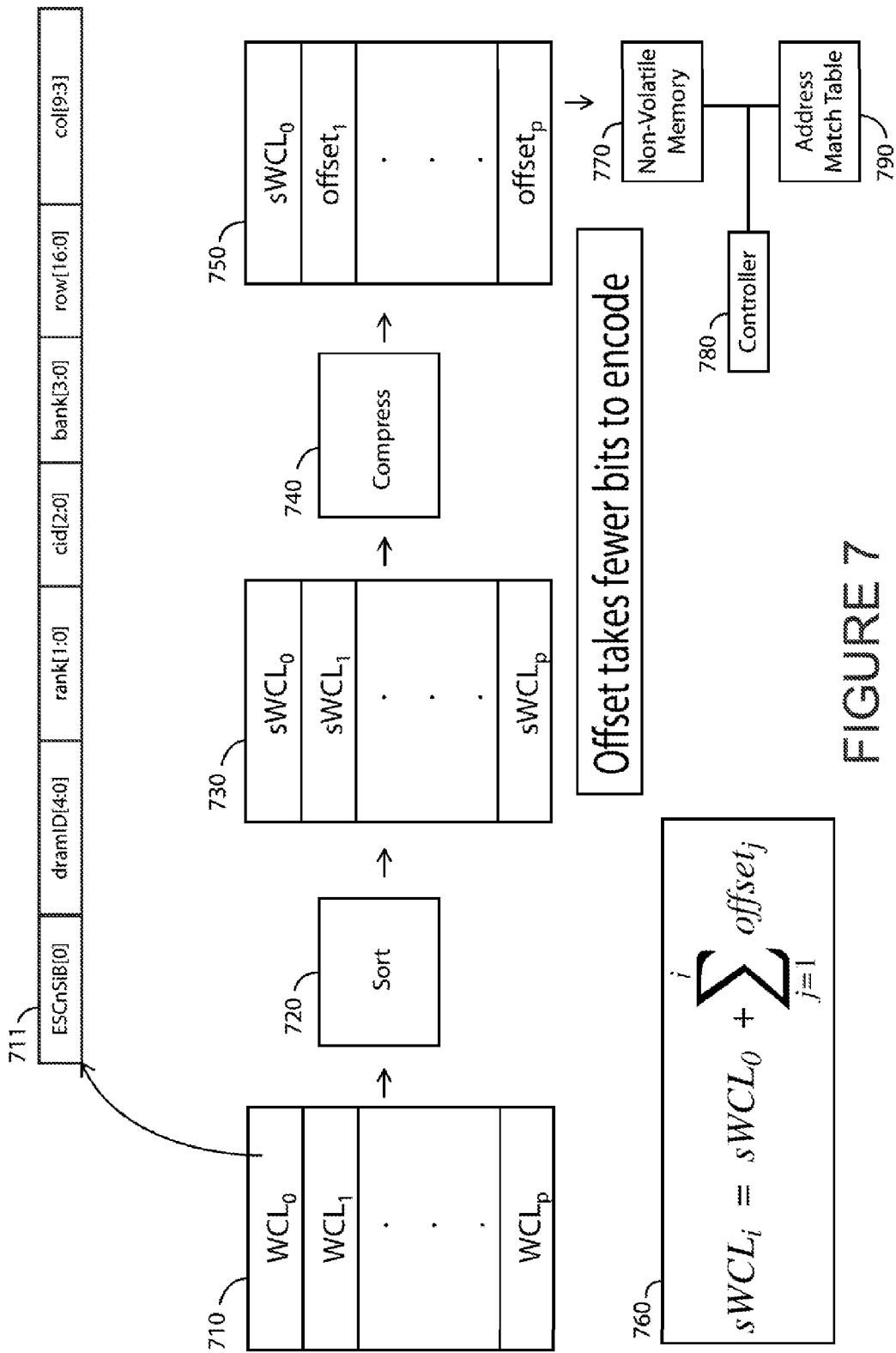
FIG. 7 illustrates a simplified flow diagram of a method for manufacturing a dynamic random access memory device according to an embodiment of the present invention.

In a specific embodiment of this architecture, the content entries are a list of dynamic random access memory (DRAM) address locations that need to be stored in an ASIC for repair during run-time. FIG. 7 illustrates a simplified flow diagram of a method for manufacturing a dynamic random access memory device according to an embodiment of the present invention. This figure shows the general flow of the compression approach. The compression is done off-chip during production and only the compressed entries are saved in the non-volatile storage. The content entries in FIG. 7 are weak cell addresses (i.e. defective DRAM cells detected during manufacture tests) and are enumerated by a weak cell list (WCL) 710.

The first state in the compression flow is the sorting (Sort block 720) of the content entries list 710. In FIG. 7, the sorted list is denoted by sWCL 730. The sorted list is further processed by a compressing state (Compress block 740) to create a new list that has, as a header element, the first content entry in the sorted list (sWCLO). Subsequent entries are stored as a series of offset values, which can be defined by the recurrence equation 760. Each of the WCL entries can be represented by the list entry 711. Further details regarding the entry fields are described in FIG. 8. Also, the sorted and compressed address list can be provided to a non-volatile memory 770 that is coupled to a controller and an address match table (AMT) 790.

This compression flow applies to any list of content entries in a non-volatile storage whose functionality is storage-order independent. Some content entries, like instruction program code sequences, are storage order dependent and are not candidates for this compression flow.

In an embodiment, the present invention provides a module apparatus. This apparatus can include a non-volatile memory (NVM) device 770 and an address match table (AMT) 790. The NVM 770 can include an address listing of a plurality of bad memory cells of a memory device. Each of the bad memory cells can be a faulty or weak memory cell.

This address listing can be configured as a compressed format including a first content entry in a sorted list of the address listing and a series of offset values as provided by a recurrence relationship, which can be that described previously with recurrence equation 760. Each of the off-set values can be within a size of a quanta according to a determined quanta size. Each of the off-set values can also be within multiple quanta if the off-set value is larger than the determined quanta. Also, the first content entry can be uncompressed, while the series of off-set values are Delta Encoded Entries. Each of the Delta Encoded Entries can be provided in at least one quanta.

AMT 790 can be configured for receiving the address listing from the NVM 770 in an uncompressed format from the compressed format. Furthermore, this module apparatus can include a monolithically integrated non-volatile memory with the AMT. Of course, there can be other variations, modifications, and alternatives.

FIGS. 8 and 9 show the details of the uncompressed WCL record or entry and encoding of the offset values in delta quanta values. FIG. 9 also defines the compression factor metric and indicates its dependence on quanta value. For a given list of content entries, a search algorithm [a sample listing is provided in Appendix A] is developed that finds a quanta value that gives a minimum compression factor. This practical approach allows the non-volatile storage to be updated at the time of manufacture and the processing of the compression to be done offline.

As shown in FIG. 8, the entry can include the fields provided under "Field Description" including: ESCnSiB, dra-mID, rank, cid, bank, row, and col. This can represent the record structure of the first sorted random content entry and subsequent Delta Encoded entries. ESCnSIB can use one bit that represents either an ESC entry (0) to an SiB Entry (1). The dram ID uses five bits and identifies the DRMA device within a rank. This can be one of 18 in×4 devices or one of 9 in×8 devices. The rank field using two bits can provide the rank ID for one of 4 ranks. The cid using three bits provides the chip ID and the bank using four bits identifies one of 16 banks in the DRAM device within a rank and dram ID. The row using 17 bits provides the row address, which can be of an 8 Gbit DDR4 DRAM (2G×4), or other DRAM devices and combinations thereof. The col using 7 bits provides the column address.

In a specific embodiment, this entry can represent an uncompressed entry, which can be the first content entry with an uncompressed 39-bit record. Subsequent offset locations can have Delta Encoded Compressed Records. These are shown with the "D" entries 0 through n−1 that are provided in specified quanta.

FIG. 9 shows a delimitation of delta quanta sequences for offset values. The delta offset is determined by concatenating the delta entries D(i−1) to D(0) such that D(i−1)[Quanta]=1 and D(i−2) [Quanta] through D(0)[Quanta]=0. The next delta offset starts are Di[Quanta:0]. The value of the quanta influences the compression factor (Compression Factor=100× Compressed Size/Uncompressed Size).

FIG. 10 demonstrates the statistical expectation of the compression factor for a 4×18×1024 length, 39 bit wide content address list. As shown, the expected offset value is $\sim = 2^{22.83}$. The expected compression factor is 58.53. In a specific embodiment, this can be the best expected compression factor. No quantization overhead is assumed. Quantization has non-monotonic impact on the compression factor.

FIG. 11 illustrates a simplified table of compression factors for an address lit according to an embodiment of the present invention. Using a search algorithm, as provided by Appendix A for example, various compression factor values can be obtained for a set of quanta values. These results illustrate a search done over a large collection of weak cell lists and yield the optimum compression factor values close to the theoretically predicted expected compression factor. These results, which show the compression factor dependence on quanta size and demonstration of local optimum values, are shown in the table of FIG. 11.

Figure 12:
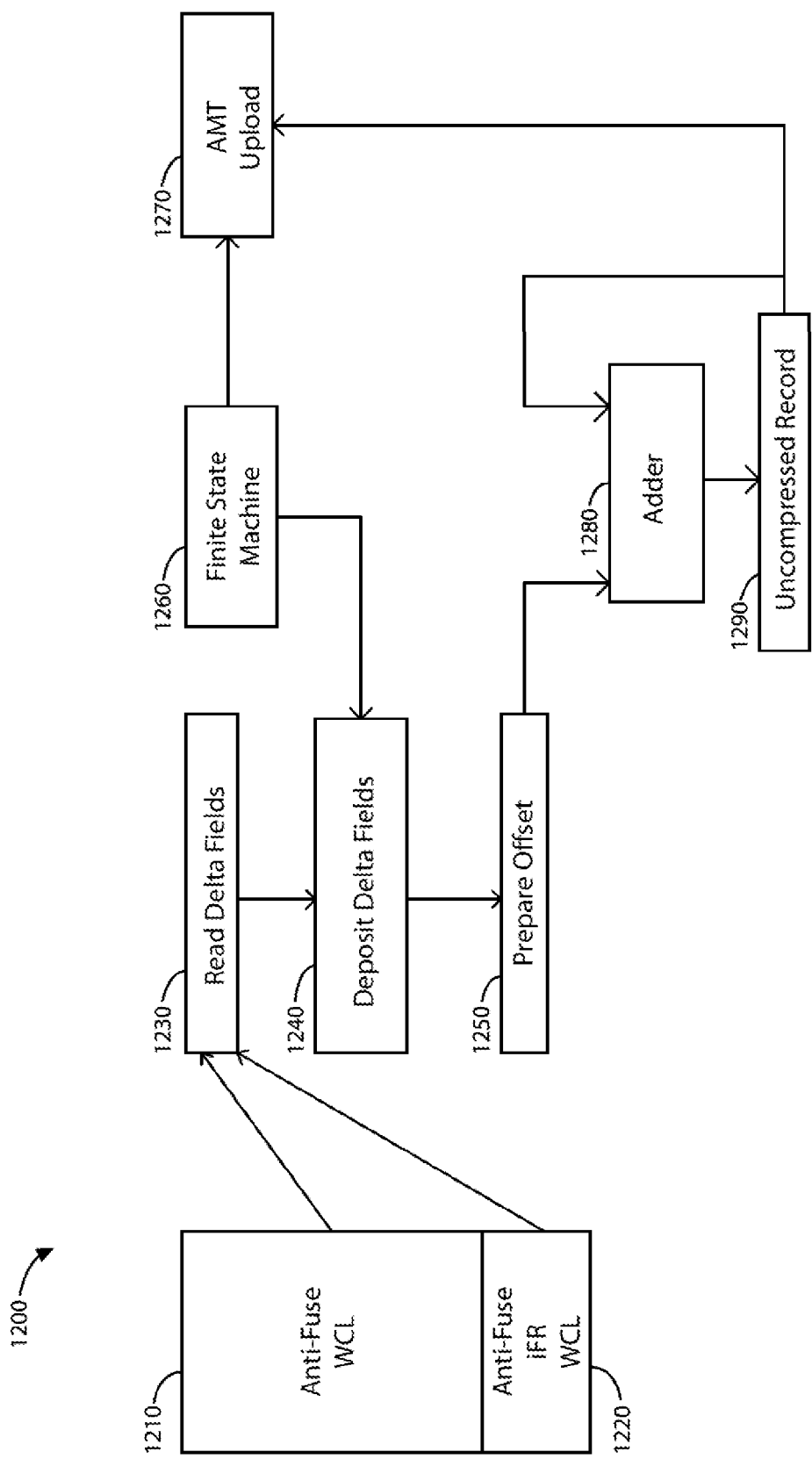
FIG. 12 illustrates a simplified block diagram of a module apparatus according to an embodiment of the present invention.

FIG. 12 illustrates a simplified block diagram of an architecture for reading and decompressing content entries from a non-volatile storage. The Anti-Fuse block 1210 shown is a one-time-programming (OTP) non-volatile storage structure. The finite-state machine (FSM) 1260 block orchestrates reading of the compressed WCL entries into the Read-Delta-Field block 1230 and the preparation of offset fields through the Deposit-Delta-Field 1240 and Prepare-Offset 1250 blocks. The FSM block 1260 also orchestrates the accumulation of the offset fields through the Adder block 1280 and generates successive uncompressed WCL entries through the Uncompressed-Record block 1290. The uncompressed WCL entries are uploaded in a volatile memory structure called the Address Match Table (AMT) 1270.

The decompression architecture has a feature to accommodate in-Field-Repair (iFR) update of new weak cell lists into a provisioned and un-programmed area in the Anti-Fuse structure 1210. After the iFR update is done (denoted by Anti-Fuse iFR WCL block 1220) the FSM 1260 in the decompression architecture uses the iFR WCL uncompressed entries as the most recent and ignores the corresponding old entries in the Anti-Fuse WCL compressed list.

In a specific embodiment, the Anti-Fuse WCL 1210 and the Anti-Fuse iFR WCL 1220 can be include in a non-volatile memory (NVM). The NVM can be loaded with the compressed WCL using a process outside of the RCD buffer using an external tester and processor. The Anti-Fuse iFR WCL 1220 location in the NVM contains updated WCL information about newly repaired DRAM devices on the DIMM. During the decompression process, this updated iFR entry is used to upload the AMT with the most recent WCL information, which can be useful for in-field repair (iFR).

In an example, the present invention provides a method for operating a memory interface device, as outlined below.

1. Test a DRAM device using a testing process;
2. Identify a plurality of bad memory cells of the DRAM device;
3. Determine a list of addresses associated with the plurality of bad memory cells of the DRAM device;
4. Sort the list of address of the bad DRAM memory cells;
5. Subject the information form the sorted address list to a compression process to provide a compressed format;
6. Store the compressed format in to a non-volatile memory;
7. Initiate a decompression process of the compressed format
8. Load the address list into an address match table for cell repair; and
9. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 13:
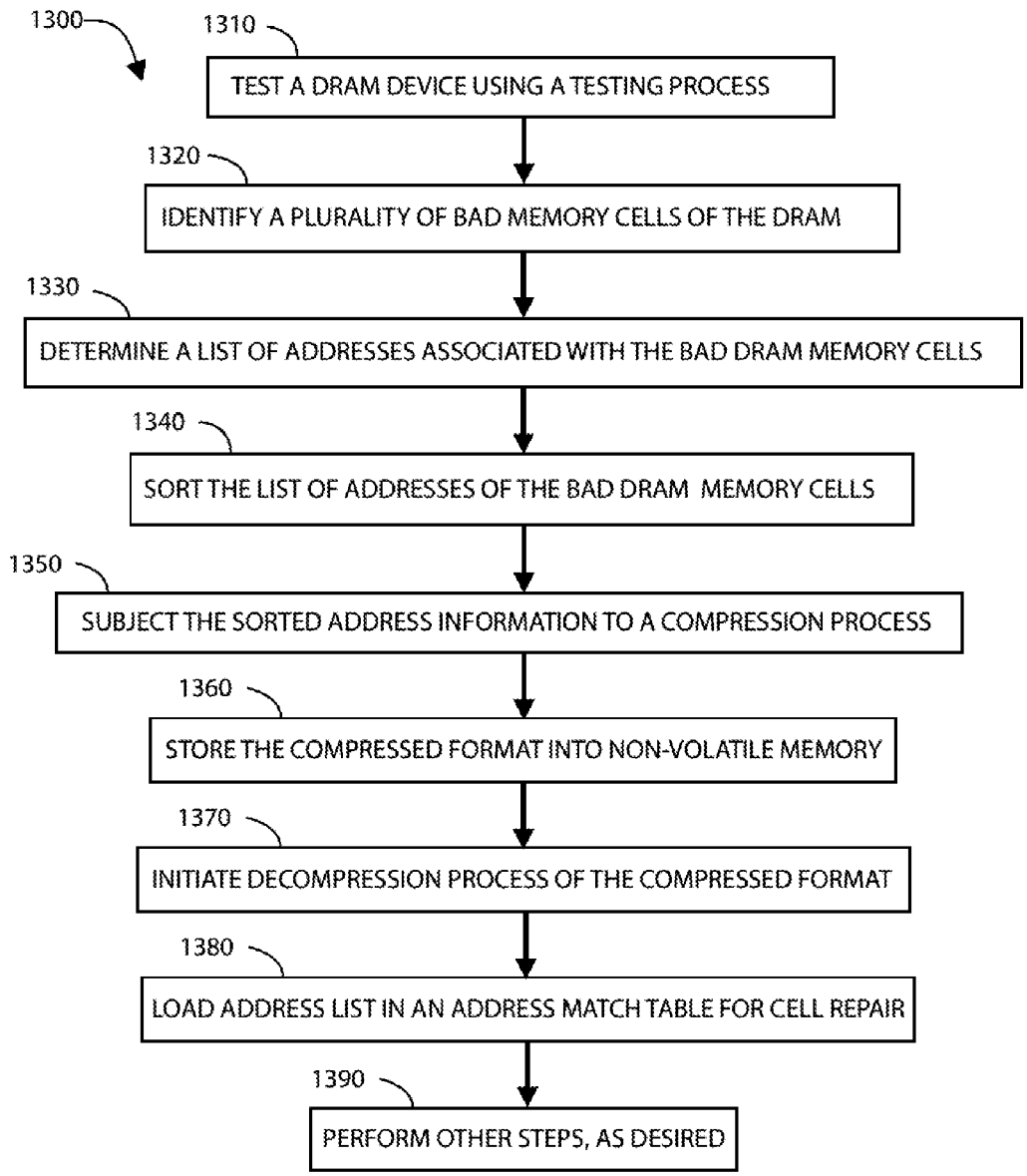
FIG. 13 illustrates a simplified flow diagram for operating an address match process for replacing a bad cell with a spare cell according to an embodiment of the present invention.

FIG. 13 illustrates a simplified flow diagram for operating an address match process for replacing a bad cell with a spare cell according to an embodiment of the present invention. As shown, method 1300 includes a variety of steps 1310 through 1390. The method can include testing a DRAM device using a testing process, step 1310. The DRAM device can include a plurality of memory arrays and each of the memory arrays can include a plurality of memory cells. Under control of a computing device, a plurality of bad memory cells from the DRAM device can be identified, step 1320. These bad memory cells can be weak or faulty memory cells. A list of addresses associated with this plurality of bad memory cells can be determined, step 1330, and sorted in either an ascending or descending order, step 1340.

The information from the sorted list of address can be subjected to a compression process, step 1350, under control by the computing device. The result of the compression process can be a compressed format including a first content entry in the sorted list and a series of off-set values as provided by a recurrence relationship, for example the recurrence equation described in FIG. 7.

In a specific embodiment, the first entry can be uncompressed, while the series of off-set values are Delta Encoded Entries. The method can further include determining a quanta size for the compression process and also successively storing each of the off-set values within a size of a quanta according to the quanta size. Multiple quanta can be used if the off-set value is larger than the size of the quanta.

The compressed format can then be stored into a non-volatile memory, step 1360. A process to decompressed the compressed format can be initiated, step 1370. The compressed format can be decompressed during an in-field repair process. The decompressed list of address can be loaded into an address match table for use in replacing bad memory cells with spare memory cells, step 1380.

In an embodiment, the method can include subjecting the DRAM device to an in-field repair process and determining an updated list of address associated with the plurality of bad memory cells after the in-field repair process. This updated list can be subjected to a compression process with an updated first content entry and a series of updated off-set values as provided by a recurrence relationship. This updated compressed format can be stored into the non-volatile memory. In a specific embodiment, the NVM can include an Anti-Fuse WCL location and an Anti-Fuse iFR WCL location, as described in FIG. 12. The Anti-Fuse iFR WCL location in the NVM can contain updated WCL information about newly repaired DRAM devices on the DIMM. During the decompression process, this updated iFR entry can be used to upload to the AMT with the most recent WCL information, which can be useful for iFR processes. Other steps can be performed as desired, step 1390.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

APPENDIX A

```
#include <stdio.h>
#include <stdlib.h>
#include <math.h>
#define addrWidth 21
#define rowMask 0x1ffffc
#define colMask 0x7f
#define rowWidth 0x1ffff
#define rowShift 17
#define bankMask 0xf
#define POLY0 0x9839b130117136f1
#define POLY1 0x26260808cc0c0898
#define POLY2 0x8001103113222042
#define POLY3 0x4004408800880
#define POLY4 0x00000020000
#define WCPD 1024
#define QUANTA 21
unsigned long poly[5] = {POLY0, POLY1, POLY2, POLY3, POLY4};
unsigned long wcp[5] = {POLY0, POLY1, POLY2, POLY3, POLY4 | (0x80000000000LL)};
unsigned long col1_miss;
unsigned long col2_miss;
double siB_size=0.0;
double siB_av=0.0;
double siB_var=0.0;
unsigned long wc_table[72*WCPD];
double process_compression(unsigned on length, int iter) {
  int i, j;
  int flag1=0;
  int flag2=0;
  int flag=0;
  double cSize=38.0;
  double tSize;
  unsigned long delta;
  for (i=0; i < (length-1); i++) {
    delta = wc_table[i+1] - wc_table[i];
    if (delta > 0)
      tSize = ceil(log2((doube) delta));
    else
      tSize = 0.0;
    tSize = ceil(tSize/(double) QUANTA) * (1.0 + (double) QUANTA);
    cSize = cSize + tSize;
  }
  siB_av = (siB_av * (double) (iter-1) + cSize)/(double) (iter);
  siBvar = (siBvar * (double) (iter-1) + cSize*cSize)/(double) (iter);
  return (cSize);
}
void update(void) {
  int i;
  if (wcp[4] & 0x80000000000LL) {
    for (i=4; i>0; i--) {
      if (wcp[i-1]&0x8000000000000000LL)
        wcp[i] = (wcp[i] << 1) | 0x1 ;
      else
        wcp[i] = wcp[i] << 1;
    }
    wcp[0] = wcp[i] << 1;
    for (i = 0; i < 5; i++)
      wcp[i] = wcp[i] ^ poly[i];
  }
  else {
    for (i=4; i>0; i--) {
      if (wcp[i-1]&0x8000000000000000LL)
```

APPENDIX A-continued

```
        wcp[i] = (wcp[i] << 1) | 0x1;
      else
        wcp[i] = wcp[i] << 1;
    }
    wcp[0] = wcp[0] << 1;
  }
}
int compare_long (const void *a, const void *b)
{
  const unsigned long *da = (const unsigned long *) a;
  const unsigned long *db = (const unsigned long *) b;
  return (*da > *db) - (*da < *db);
}
main( ) {
  int i,j;
  unsigned long dramRankID, bank, row_address, col_address;
  unsigned long iter;
  unsigned long cSize;
  for (iter=0; iter < 100000; iter++) {
    for (i=0; i < (72*WCPD) ; i++) {
      update( );
      dramRankID = (i >> 10); // 7-bits
      bank = wcp[2] & bankMask; // 4-bits
      row_address = wcp[1] & rowWidth; /// 17-bit row address
      col_address = wcp[0] & colMask; // 7-bit column address
      wc_table[i] = (dramRankID << 31) | (bank << 24) |
      (row_address << 7 ) |
  col_address;
    }
    qsort(wc_table, 72*WCPD, sizeof(unsigned long), compare_long);
    cSize = process_compression(72*WCPD,iter+1);
    // printf("comp_ratio = %lf\n", (cSize*39.0/38.0)/(72.0 * (double) WCPD * 39.0));
  }
  siB_size = (72.0 * (double) WCPD * 39.0);
  printf("cSize_av = %lf, %lf; cSize_std = %lf, %lf\n", siB_av*39.0/38.0,
siB_av/siB_size*39.0/38.0,
         sqrt(siB_var-siB_av*siB_av)*39.0/38.0, (siB_av+3*sqrt(siB_var-siB_av*siB_av))/siB_size*39.0/38.0);
}
```

The invention claimed is:

1. A method of manufacturing a dynamic random access memory device, the method comprising:
testing a DRAM device using a testing process, the DRAM device comprising a plurality of memory arrays, each of the plurality of memory arrays comprising a plurality of memory cells;
identifying, under control by a computing device, a plurality of bad memory cells from the DRAM device;
determining a list of addresses associated with the plurality of bad memory cells from the DRAM device;
sorting the list of address in either ascending or descending order;
subjecting the information from the sorted list of addresses to a compression process, under control by the computing device, to provide a compressed format including a first content entry in the sorted list and a series of off-set values as provided by a recurrence relationship; and
storing the compressed format into a non-volatile memory.

2. The method of claim 1 wherein the first content entry is uncompressed, and wherein the series of off-set values are Delta Encoded Entries.

3. The method of claim 1 further comprising initializing an interface integrated circuit device coupled to the DRAM device to initialize a decompression process of the compressed format in the non-volatile memory; and loading the list of addresses into an address match table.

4. The method of claim 1 further comprising determining a quanta size for the compression process.

5. The method of claim 4 further comprising successively storing each of the off-set values within a size of a quanta according to the quanta size, and using multiple quanta if the off-set value is larger than the size of the quanta.

6. The method of claim 1 further comprising decompressing the compressed format into an address match table during an in-field repair process.

7. The method of claim 1 wherein each of the plurality of bad memory cells is a faulty or weak memory cell.

8. The method of claim 1 further comprising
subjecting the DRAM device to an in-field repair process;
determining an updated list of addresses associated with the plurality of bad memory cells of the DRAM device;
subjecting the information from the updated list of addresses to a compression process, under control by the computing device, to provide an updated compressed format including an updated first content entry in the updated list and a series of updated off-set values as provided by a recurrence relationship; and
storing the updated compressed format into the non-volatile memory.

9. A method of manufacturing a dynamic random access memory cell, the method comprising:
testing a DRAM device using a testing process, the DRAM device comprising a plurality of memory arrays, each of the plurality of memory arrays comprising a plurality of memory cells;
identifying, under control by a computing device, a plurality of bad memory cells from the DRAM device;
determining a list of addresses associated with the plurality of bad memory cells from the DRAM device;
sorting the list of addresses in either an ascending or a descending order;
subjecting the information from the sorted list of addresses to a compression process, under control by the computing device, to provide a compressed format including a first content entry in the sorted list and a series of off-set values as provided by a recurrence relationship;
storing the compressed format into a non-volatile memory;
initiating a process to decompress the compressed format; and
loading the list of addresses in an address match table for use in replacing bad memory cells with spare memory cells.

10. The method of claim 9 wherein the first content entry is uncompressed; and wherein the series of off-set values are Delta Encoded Entries.

11. The method of claim 9 further comprising determining a quanta size for the compression process.

12. The method of claim 11 further comprising successively storing each of the off-set values within a size of a quanta according to the quanta size; and using multiple quanta if the off-set value is larger than the size of the quanta.

13. The method of claim 9 wherein the decompressing of the compressed format is during an in-field repair process.

14. The method of claim 9 wherein each of the bad memory cells is faulty or weak memory cell.

15. The method of claim 9 further comprising
subjecting the DRAM device to an in-field repair process;
determining an updated list of addresses associated with the plurality of bad memory cells of the DRAM device;
subjecting the information from the updated list of addresses to a compression process, under control by the computing device, to provide an updated compressed format including an updated first content entry in the updated list and a series of updated off-set values as provided by a recurrence relationship; and
storing the updated compressed format into the non-volatile memory.

16. A module apparatus, the apparatus comprising:
a non-volatile memory device comprising an address listing of a plurality of bad memory cells of a memory device, the address listing being configured as a compressed format including a first content entry in a sorted list of the address listing and a series of off-set values as provided by a recurrence relationship; and
an address match table configured for receiving the address listing from the non-volatile memory device in an uncompressed format from the compressed format.

17. The device of claim 16 wherein each of the off-set values is within a size of a quanta according to a quanta size; and wherein each of the off-set values is within multiple quanta if the off-set value is larger than the quanta size.

18. The device of claim 16 wherein each of the bad memory cells is a faulty or weak memory cell.

19. The device of claim 16 wherein the first content entry is uncompressed; and wherein the series of off-set values are Delta Encoded Entries.

20. The device of claim 19 wherein each of the Delta Encoded Entries is provided in at least one quanta.

21. The device of claim 16 wherein the module apparatus comprises a monolithically integrated non-volatile memory and the address match table.

* * * * *